(12) United States Patent
Matsui (10) Patent No.: US 12,244,291 B2
(45) Date of Patent: Mar. 4, 2025

(54) CRYSTAL ELEMENT AND CRYSTAL DEVICE

(71) Applicant: KYOCERA Corporation, Kyoto (JP)

(72) Inventor: Yoshiji Matsui, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 420 days.

(21) Appl. No.: 17/615,165

(22) PCT Filed: May 29, 2020

(86) PCT No.: PCT/JP2020/021420
§ 371 (c)(1),
(2) Date: Nov. 30, 2021

(87) PCT Pub. No.: WO2020/241849
PCT Pub. Date: Dec. 3, 2020

(65) Prior Publication Data
US 2022/0239277 A1 Jul. 28, 2022

(30) Foreign Application Priority Data
May 30, 2019 (JP) .................................. 2019-101757

(51) Int. Cl.
*H03H 9/17* (2006.01)
*H03H 9/13* (2006.01)

(52) U.S. Cl.
CPC ................. *H03H 9/17* (2013.01); *H03H 9/13* (2013.01)

(58) Field of Classification Search
CPC ........... H03H 9/17; H03H 9/13; H03H 9/1021
See application file for complete search history.

(56) References Cited

U.S. PATENT DOCUMENTS

| 5,925,968 A | * | 7/1999 | Yachi | ................... | H03H 9/0509 |
| | | | | | 310/366 |
| 2016/0260886 A1 | * | 9/2016 | Kohda | ..................... | H03H 9/19 |
| 2020/0084883 A1 | * | 3/2020 | Zhao | ..................... | H05K 1/189 |

FOREIGN PATENT DOCUMENTS

| JP | 2001-251154 A | | 9/2001 |
| JP | 2003046367 A | * | 2/2003 |
| JP | 2004-040198 A | | 2/2004 |
| JP | 2011066779 A | | 3/2011 |
| JP | 2016-034061 A | | 3/2016 |
| JP | 2017079347 A | | 4/2017 |

* cited by examiner

*Primary Examiner* — Andrea Lindgren Baltzell
*Assistant Examiner* — Kimberly E Glenn
(74) *Attorney, Agent, or Firm* — Volpe Koenig (57) ABSTRACT

The crystal element includes: a vibration part including a first face and a second face; a flat plate part including a first face and a second face, which has a thickness thicker than a thickness of the vibration part and is disposed in an outer edge of the vibration part on a plan view; a fixing part including a first face and a second face, which has a thickness thicker than the thickness of the flat plate part and is disposed in an outer edge of the flat plate part on a plan view; an excitation electrode disposed on the first face and the second face of the vibration part; a mounting electrode disposed at least on one of the first face and the second face of the fixing part; and a wiring electrode that electrically connects the excitation electrode and the mounting electrode.

19 Claims, 4 Drawing Sheets

CRYSTAL ELEMENT AND CRYSTAL DEVICE

FIELD

The present disclosure relates to a crystal element of a thickness-shear vibration mode and to a crystal device that includes the crystal element. Examples of the crystal device may be a crystal unit, a crystal oscillator, and the like.

BACKGROUND

The crystal element of the thickness-shear vibration mode is acquired by forming excitation electrodes made of a metal film pattern on both main surfaces of an AT-cut crystal plate (for example, see Japanese Patent Application Laid-open No. 2016-34061). The oscillation frequency of the crystal element is inversely proportional to the thickness of the crystal plate. That is, the higher the oscillation frequency, the thinner the crystal plate.

The crystal device generates a specific oscillation frequency by using the piezoelectric effect and the inverse piezoelectric effect of the crystal element. A typical crystal device has a structure in which the crystal element is housed in a package and airtightly sealed by a lid.

SUMMARY

A crystal element according to the present disclosure includes, defining that a front side of two faces in a front-and-back relation is a first face, a back face is a second face, and a dimension of a direction vertically going through the first face and the second face is a thickness: a vibration part that includes a first face and a second face; a flat plate part that includes a first face and a second face, the flat plate part having a thickness thicker than a thickness of the vibration part and being disposed in an outer edge of the vibration part on a plan view; a fixing part that includes a first face and a second face, the fixing part having a thickness thicker than the thickness of the flat plate part and being disposed in an outer edge of the flat plate part on a plan view; an excitation electrode disposed on the first face and the second face of the vibration part; a mounting electrode disposed at least on one of the first face and the second face of the fixing part; and a wiring electrode that electrically connects the excitation electrode and the mounting electrode.

A crystal device according to the present disclosure includes: the crystal element according to the present disclosure; a base body where the crystal element is disposed; and a lid that, together with the base body, airtightly seals the crystal element.

DETAILED DESCRIPTION

Recently, the mechanical strength of the crystal plates tends to be deteriorated since the crystal plates become thinner as the oscillation frequency of the crystal elements becomes higher. For example, when the oscillation frequency is 150 MHz, the thickness of the crystal plate is about 11 In this case, since the crystal plate is too thin, distortion is likely to occur in the crystal plate due to the stress. When distortion occurs in the crystal plate, the vibration balance of the vibration part is decreased. Thereby, the electrical characteristic of the crystal element is deteriorated. Examples of the deterioration in the electrical characteristic may be an increase in the equivalent series resistance value and deterioration in the frequency temperature characteristic (occurrence of a dip and the like). This issue is prominent particularly in the crystal element with the oscillation frequency of 150 MHz, since the crystal plate thereof is considerably thin.

The crystal element according to the present disclosure includes a vibration part, a flat plate part that is thicker than the vibration part and disposed in an outer edge of the vibration part, and a fixing part that is thicker than the flat plate part and disposed in an outer edge of the flat plate part, so that it is possible to achieve a configuration in which the outer edge of the thin vibration part is supported by the thick plate part, and the outer edge of the flat plate part is supported by the still thicker fixing part. As a result, even if the vibration part becomes thinner as the oscillation frequency becomes higher, it is possible to maintain the mechanical strength of the crystal element and to secure the stable electrical characteristic thereby.

Hereinafter, modes for embodying the present disclosure (hereinafter, referred to as "embodiments") will be described with reference to the accompanying drawings. Note that same reference signs are used for substantially the same structural elements in the specification and the drawings to avoid duplicated explanations as appropriate. Shapes in the drawings are illustrated in such a manner to be easily comprehended by those skilled in the art, so that dimensions and ratios thereof are not necessarily consistent with the actual ones.

First Embodiment

Figure 1:
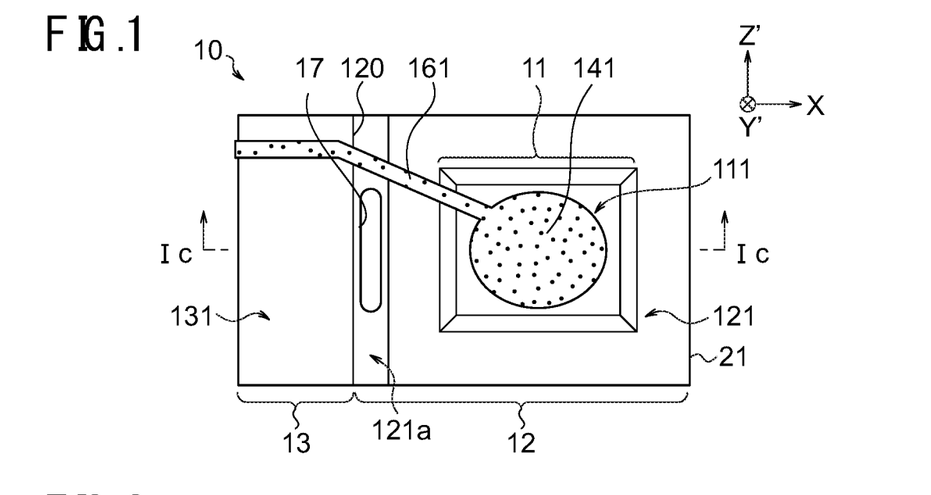
FIG. 1 is a plan view illustrating a crystal element according to a first embodiment.
Figure 2:
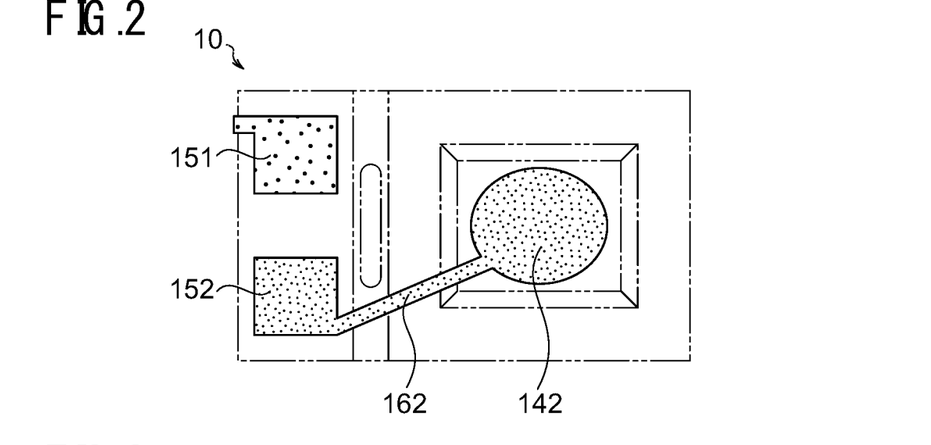
FIG. 2 is a plan view viewed through from the back side of the crystal element.
Figure 3:
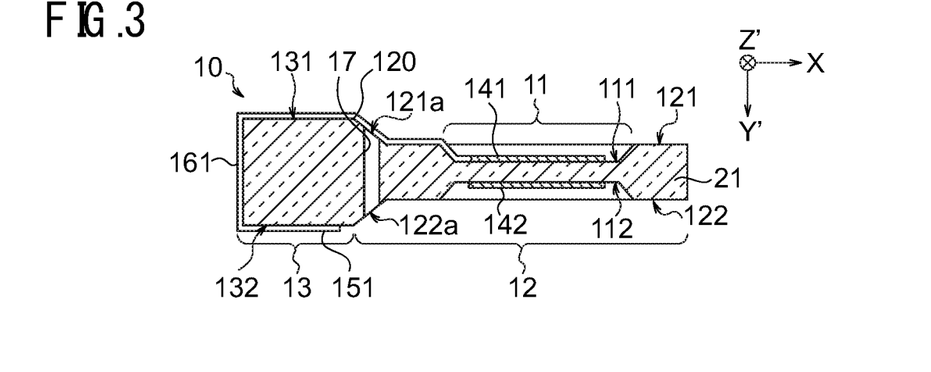
FIG. 3 is a sectional view taken along the line Ic-Ic of FIG. 1.
Figure 4:
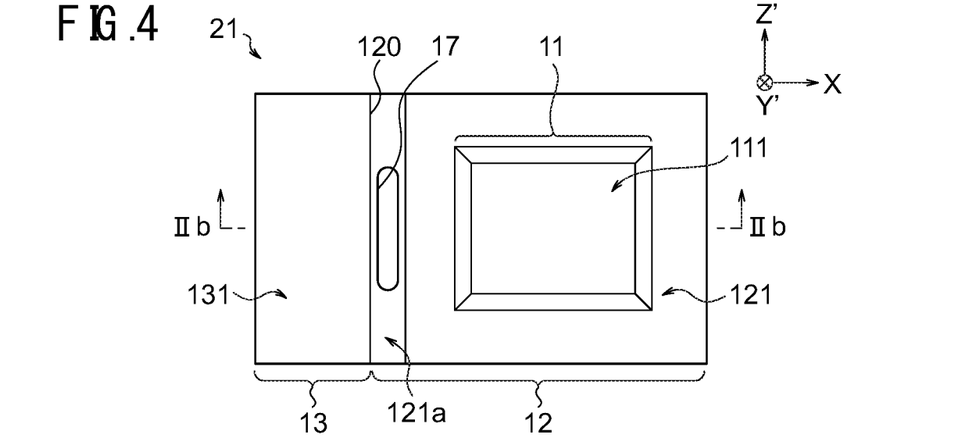
FIG. 4 is a plan view illustrating a crystal plate according to the first embodiment.
Figure 5:
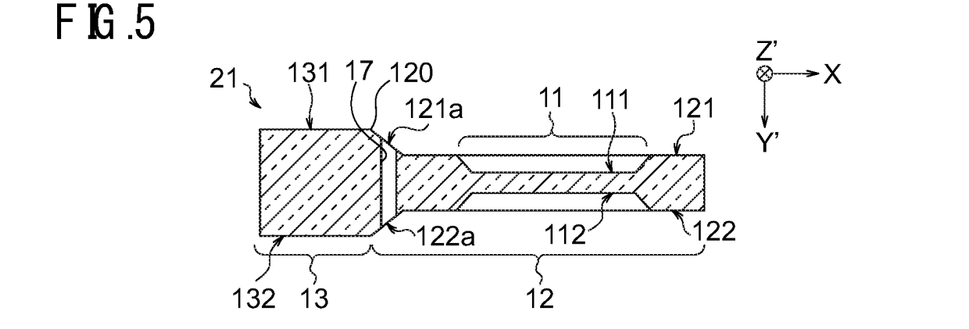
FIG. 5 is a sectional view taken along the line IIb-IIb of FIG. 4.
Figure 6:
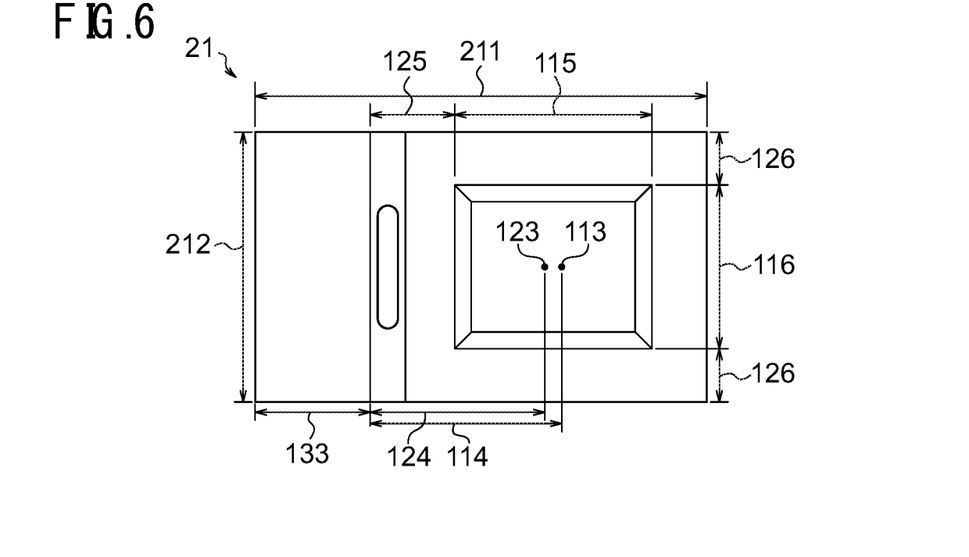
FIG. 6 is a plan view for describing examples of the dimensions of the crystal plate illustrated in FIG. 4.

FIG. 1 is a plan view illustrating a crystal element 10, FIG. 2 is a plan view viewed through from the back side of the crystal element 10, and FIG. 3 is a sectional view taken along the line Ic-Ic of FIG. 1. FIG. 4 is a plan view illustrating a crystal plate 21, FIG. 5 is a sectional view taken along the line IIb-IIb of FIG. 4, and FIG. 6 is a plan view for describing examples of the dimensions of the crystal plate 21. Hereinafter, explanations will be provided with reference to those drawings.

The front side out of the two faces in a front-and-back relation is defined as "first face", the back side thereof is defined as "second face", and the dimension in a direction vertically going through the first face and the second face is defined as "thickness". The crystal element 10 of the first embodiment includes: a vibration part 11 having a first face 111 and a second face 112; a flat plate part 12 having a first face 121 and a second face 122, which is thicker than the vibration part 11 and disposed in an outer edge of the vibration part 11 on a plan view; a fixing part 13 having a first face 131 and a second face 132, which is thicker than the flat plate part 12 and disposed in an outer edge of the flat plate part 12 on a plan view; excitation electrodes 141, 142 disposed on the first face 111 and the second face 112 of the vibration part 11; mounting electrodes 151, 152 disposed at least on one of the first face 131 and the second face 132 of the fixing part 13; and wiring electrodes 161, 162 that electrically connect the excitation electrodes 141, 142 and the mounting electrodes 151, 152.

The first faces 111, 121, 131 and the second faces 112, 122, 132 may be configured as follows. The first face 121 of the flat plate part 12 and the first face 131 of the fixing part 13 are on different planes. The second face 122 of the flat plate part 12 and the second face 132 of the fixing part 13 are on different planes. The first face 111 of the vibration part 11 and the first face 121 of the flat plate part 12 are on different planes. The second face 112 of the vibration part 11 and the second face 122 of the flat plate part 12 are on different planes. That is, the first faces 111, 121, 131 of each of the vibration part 11, the flat plate part 12, and the fixing part 13 are disposed in a step-like manner, and the second faces 112, 122, 133 thereof are also disposed in a step-like manner.

On a plan view, it may also be defined that the vibration part 11, the flat plate part 12, and the fixing part 13 are in a substantially rectangular shape, the flat plate part 12 is disposed to surround all sides of the rectangular shape of the vibration part 11, and the fixing part 13 exists only on one side 120 of the rectangular shape of the flat plate part 12. When the flat plate part 12 is disposed to surround all sides of the vibration part 11, the vibration part 11 comes to form a recessed part that is provided in the center of the flat plate part 12. Note here that "substantially rectangular shape" includes a square, a rectangle with four rounded corners, and the like. Furthermore, the flat plate part 12 may surround not all sides of the vibration part 11 but three sides or two sides thereof. In that case, the flat plate part 12 including the vibration part 11 forms a substantially rectangular shape. The fixing part 13 may not be disposed only on the one side 120 of the flat plate part 12 but may by disposed to surround two sides, three sides, or all sides thereof. In that case, the fixing part 13 including the flat plate part 12 forms a substantially rectangular shape.

The first face 121 and the second face 122 of the flat plate part 12 may respectively include inclined faces 121a and 122a that become thinner as leaving away from the fixing part 13. There may be either one of the inclined faces 121a and 122a. Furthermore, the inclined faces 121a and 122a are formed by wet-etching when the crystal axis of the crystal plate is set in the manner illustrated in the drawings.

The crystal element 10 may further include a through-hole 17 opened through in the thickness direction between the mounting electrodes 151, 152 and the vibration part 11. In the first embodiment, the through-hole 17 is formed in the inclined faces 121a and 122a.

In FIG. 4 and FIG. 6, a distance 114 from a center 113 of the vibration part 11 to the fixing part 13 may be defined to be longer than a distance 124 from a center 123 of the flat plate part 12 to the fixing part 13 on a plan view.

In FIG. 4 and FIG. 6, assuming that the direction perpendicular to the one side 120 of the flat plate part 12 where the fixing part 13 is disposed is defined as the length direction on a plan view, a distance 125 from the fixing part 13 to the vibration part 11 in the flat plate part 12 may be defined to be one half or more and twice or less of the dimension (length 115) of the vibration part 11 in the length direction.

In FIG. 4 and FIG. 6, assuming that the direction in parallel to the one side 120 of the flat plate part 12 where the fixing part 13 is disposed is defined as the width direction on a plan view, a distance 126 from the outer edge of the flat plate part 12 to the vibration part 11 in the width direction of the flat plate part 12 may be defined to be larger than the dimension (length 116) of the vibration part 11 in the width direction.

Next, the crystal element will be described in more detail.

The crystal element 10 operates in the thickness-shear vibration mode, and the oscillation frequency (fundamental wave) is 150 MHz or more, for example. The vibration part 11, the flat plate part 12, and the fixing part 13 are formed with a single crystal plate 21. The excitation electrodes 141, 142, the mounting electrodes 151, 152, and the wiring electrodes 161, 162 are formed with a metal pattern of a same material.

The crystal plate 21 is an AT-cut crystal plate. That is, assuming that a rectangular coordinate system XYZ with the X-axis (electrical axis), the Y-axis (mechanical axis), and the Z-axis (optical axis) in the crystal is rotated by 30° or more and 50° or less (for example, 35°15') to define a rectangular coordinate system XY'Z', a wafer cut in parallel to the XZ' plane is the raw material of the crystal plate 21. Furthermore, the longitudinal direction of the crystal plate 21 is in parallel to the X-axis, the lateral direction is in parallel to the Z'-axis, and the thickness direction is in parallel to the Y'-axis.

Referring to FIG. 6, examples of the dimensions are as follows. As for the crystal plate 21, a length 211 is 700 to 100 μm, and a width 212 is 400 μm. As for the vibration part 11, the length 115 and the width 116 are both 100 μm. The distance 126 from the outer edge of the flat plate part 12 to the vibration part 11 is 150 μm. The length 133 of the fixing part 13 is 50 to 200 μm.

A pair of excitation electrodes 141 and 142 is in a substantially elliptical shape on a plan view, and provided at roughly the center of the first face 111 and the second face 112 of the vibration part 11, respectively. From the excitation electrodes 141, 142, the wiring electrodes 161, 162 used for connection but not contributing to excitation are extended to the mounting electrodes 151, 152. That is, the excitation electrode 141 is electrically connected to the mounting electrode 151 via the wiring electrode 161, and the excitation electrode 142 is electrically connected to the mounting electrode 152 via the wiring electrode 162. Note that the excitation electrodes 141 and 142 are not limited to be in a substantially elliptical shape but may be in a substantially circular shape, a substantially rectangular shape, or the like, for example.

While both of the mounting electrodes 151 and 152 are disposed in the second face 132 of the fixing part 13, at least one of those may be disposed in the first face 131 of the fixing part 13. In that case, the mounting electrodes 151 and 152 may be electrically connected to a package or the like via a wire.

The metal pattern configuring the excitation electrodes 141, 142 and the like forms a laminate including a base layer made of chromium (Cr) and a conductor layer made of gold (Au), for example. That is, the base layer is disposed on the crystal plate 21, and the conductor layer is disposed on the base layer. The base layer mainly plays a role for providing an adhesion force with respect to the crystal plate 21. The conductor layer mainly plays a role for providing electrical conduction.

As the metal pattern manufacturing steps, there are following methods in which "to provide a metal film" is referred to as "to deposit a film (deposition)". The methods may be: a method which deposits a film on the crystal plate 21, forms a photoresist pattern, and performs etching; a method which forms a photoresist pattern on the crystal plate, deposits a film, and performs lift-off, a method which deposits a film while covering the crystal plate with a metal mask, and the like. For the deposition, sputtering, vapor deposition, or the like is used.

The crystal element 10 can be manufactured in a following manner by using photolithography and an etching technique, for example.

First, a corrosion resistant film is provided on the entire surface of the AT-cut crystal wafer, and a photoresist is provided thereon. Subsequently, a mask where a pattern of the external shape (including the through-hole 17) of the crystal plate 21 and the flat plate part 12 is drawn is superimposed on the photoresist, which is then exposed and developed to expose a part of the corrosion resistant film. In this state, wet-etching is performed on the corrosion resistant film. Thereafter, wet-etching is performed on the crystal wafer by using the remaining corrosion resistant film as the mask to form the external shape (uncompleted) of the crystal plate 21 and the flat plate part 12 (a flat plate part process step). Then, the external shape (uncompleted) of the crystal plate 21 and the vibration part 11 are formed in the same manner (a vibration part process step). Subsequently, the external shape (until being completely etched) of the crystal plate 21 is formed (an external shape process step). Note that "to simultaneously etch the first face and the second face of the crystal plate 21" is referred to as "double-sided etching", and "to etch either one of the first face and the second face of the crystal plate 21" is referred to as "one-sided etching". In each of the steps, double-sided etching is used.

Thereafter, the remaining corrosion resistant film is removed from the crystal wafer, and a metal film to be the excitation electrodes 141, 142, and the like is provided on the entire surface of the crystal wafer. Subsequently, a photoresist mask with a pattern of the excitation electrodes 141, 142, and the like is formed on the metal film, and an unnecessary part of the metal film is removed by etching to form the excitation electrodes 141, 142, and the like. Thereafter, an unnecessary part of the photoresist is removed to form a plurality of crystal elements 10 on the crystal wafer. At last, each of the crystal elements 10 is cut out from the crystal wafer into a piece to acquire individual crystal elements 10.

The operation of the crystal element 10 is as follows. An alternating voltage is applied to the crystal plate 21 via the excitation electrodes 141 and 142. This causes thickness-shear vibration of the crystal plate 21 such that the first face 111 and the second face 112 shift from each other, thereby generating a specific oscillation frequency. As described, the crystal element 10 operates to output signals of a specific oscillation frequency by using the piezoelectric effect and the inverse piezoelectric effect of the crystal plate 21. At this time, the thinner the thickness of the crystal plate 21 between the excitation electrodes 141 and 142 (that is, the vibration part 11), the higher the oscillation frequency.

Next, actions and effects of the crystal element 10 will be described.

(1) As described above, the crystal element 10 of the first embodiment includes: the vibration part 11 having the first face 111 and the second face 112; the flat plate part 12 having the first face 121 and the second face 122, which has a thickness thicker than the thickness of the vibration part 11 and is disposed in the outer edge of the vibration part 11 on a plan view; the fixing part 13 having the first face 131 and the second face 132, which has a thickness thicker than the thickness of the flat plate part 12 and is disposed in the outer edge of the flat plate part 12 on a plan view; the excitation electrodes 141, 142 disposed on the first face 111 and the second face 112; the mounting electrodes 151, 152 disposed at least on one of the first face 131 and the second face 132; and the wiring electrodes 161, 162 that electrically connect the excitation electrodes 141, 142 and the mounting electrodes 151, 152.

The crystal element 10 of the first embodiment includes the vibration part 11, the flat plate part 12 that is thicker than the vibration part 11 and disposed in the outer edge of the vibration part 11, and the fixing part 13 that is thicker than the flat plate part 12 and disposed in the outer edge of the flat plate part 12, so that it is possible to achieve the structure in which the outer edge of the thin vibration part 11 is supported by the flat plate part 12 and the outer edge of the thick flat plate part 12 is supported by the still thicker fixing part 13. As a result, even when the vibration part 11 becomes thinner as the oscillation frequency becomes higher, the mechanical strength of the crystal element 10 can be maintained, thereby making it possible to secure a stable electrical characteristic.

Now, an example of the effects of the crystal element 10 will be described in a specific manner. A crystal element formed with a vibration part and a fixing part without a flat plate part will be discussed as a comparison example. In this comparative example, the stress is concentrated on the boundary between the thin vibration part and the thick fixing part, and distortion is likely to occur in the thin vibration part. Therefore, when the vibration part becomes still thinner as the frequency becomes higher, the vibration part becomes more likely to be distorted. On the contrary, with the crystal element 10, the stress generated between the vibration part 11 and the fixing part 13 is dispersed or absorbed in the flat plate part 12. Therefore, the vibration part 11 is not likely to be distorted even when the vibration part 11 becomes thinner. As the stress source, there may be the gravity, the tension of the metal pattern, or the like.

Furthermore, since the vibration part 11 in the crystal element 10 with the oscillation frequency of 150 MHz or more in particular is considerably thin, it is necessary to pay close attention for the damages thereof and the like when mounting. With the crystal element 10, handleability can be improved by being mounted to a package via the fixing part 13 that is thicker than the flat plate part 12.

(2) The first faces 111, 121, 131 are disposed in a step-like manner, and the second faces 112, 122, 132 are also disposed in a step-like manner. In this case, the front side and the back side of the crystal plate 21 are in a similar configuration. Thereby, the tension of the metal pattern on the front side and the tension of the metal pattern on the back side cancel each other, so that distortion of the vibration part 11 can be suppressed further. Moreover, since the flat plate part 12 and the vibration part 11 can be formed by double-sided etching, the etching time per manufacturing step can be shortened to about one half of the case of one-sided etching.

Furthermore, such effects are increased by forming a vertically symmetric structure with the front side and the back side of the crystal plate 21. In addition, the vibration state in the upper half part and the lower half part of the crystal plate 21 becomes the same since the upper side and the lower side are symmetric with respect to the center of gravity of the crystal plate 21. Therefore, it is possible to improve the vibration balance, and to reduce the CI (crystal impedance) value.

(3) The vibration part 11, the flat plate part 12, and the fixing part 13 are in a substantially rectangular shape, the flat plate part 12 is disposed to surround all sides of the rectangular shape of the vibration part 11, and the fixing part 13 is disposed only on the one side 120 of the rectangular shape of the flat plate part 12. In a case where the vibration part 11 is in a substantially rectangular shape, the etching residue when the vibration part 11 is formed by wet-etching can be easily managed compared to a case where the vibration part 11 is in a substantially circular shape or elliptical shape. It is because the shape of the etching residue becomes simple since the crystal face exposed to the outer edge of the vibration part 11 becomes simple when the vibration part 11 is in a substantially rectangular shape. As a result, it is possible to suppress disconnection of the wiring electrodes 161 and 162 in the outer edge of the vibration part 11. Furthermore, when the flat plate part 12 is disposed to surround all sides of the vibration part 11, it is possible to support all sides of the thin vibration part 11 with the thick flat plate part 12 so that distortion generated in the vibration part 11 can be reduced further.

(4) The first face 121 of the flat plate part 12 has the inclined face 121a that becomes thinner as leaving away from the fixing part 13, or the second face 122 of the flat plate part 12 has the inclined face 122a that becomes thicker as leaving away from the fixing part 13. In that case, following effects can be achieved. The thickness of the flat plate part 12 (the inclined faces 121a and 122a) in the vicinity of the fixing part 13 becomes thicker toward the fixing part 13. Therefore, the stress transferred to the vibration part 11 side from the fixing part 13 side is absorbed or dispersed by the inclined faces 121a and 122a (gradual step), so that distortion of the vibration part 11 can be suppressed further. Furthermore, since the vibration generated in the vibration part 11 is gradually damped as going toward the fixing part 13, thereby reducing the influence of the vibration reflected by the fixing part 13 upon the vibration part 11. Therefore, it is possible to decrease the CI value since the influence of the fixing part 13 for the vibration of the vibration part 11 is suppressed by the cross sectional shape of the flat plate part 12 in the vicinity of the fixing part 13. Even though only one of the inclined faces 121a and 122a provided therein, the effect is increased further by providing the both.

(5) The through-hole 17 opened through along the thickness direction is further provided between the mounting electrodes 151, 152 and the vibration part 11. In that case, the stress transferred to the vibration part 11 side from the fixing part 13 side is absorbed or dispersed by the through-hole 17, so that distortion of the vibration part 11 can be suppressed further. In other words, when fixing the fixing part 13 to a package, it is possible to reduce distortion generated in the flat plate part 12 and also reduce distortion generated in the vibration part 11 as a result.

Furthermore, by confining the vibration energy of the vibration part 11 in the through-hole 17, the CI value can be decreased. Moreover, by forming the through-hole 17 in the inclined faces 121a, 122a, such an effect is increased in cooperation with the function of the inclined faces 121a, 122a.

(6) The distance 114 from the center 113 of the vibration part 11 to the fixing part 13 is longer than the distance 124 from the center 123 of the flat plate part 12 to the fixing part 13. In that case, the vibration part 11 is distant from the fixing part 13, so that influence of the stress when fixing the fixing part 13 to the package can be reduced.

(7) The distance 125 from the fixing part 13 to the vibration part 11 in the flat plate part 12 is one half or more and twice or less than the length 115 of the vibration part 11. When the distance 125 is less than one half of the length 115 of the vibration part 11, it is likely to have the influence of the stress from the fixing part 13. When the distance 125 exceeds twice of the length 115 of the vibration part 11, the flat plate part 12 is likely to be distorted so that the vibration part 11 is likely to be distorted as well.

(8) The distance 126 from the outer edge of the flat plate part 12 to the vibration part 11 in the width direction of the flat plate part 12 is longer than the width 116 of the vibration part 11. In that case, the width direction of the vibration part 11 can be supported by the flat plate part 12 in a sufficient dimension so that distortion generated in the vibration part 11 can be reduced further.

Other Examples

FIG. 7 to FIG. 11 are sectional views illustrating crystal plates 21 to 25 of each of first to fifth examples. Hereinafter, explanations will be provided with reference to those drawings.

Crystal plates with various sectional shapes can be acquired by forming the flat plate part and the vibration part of the first embodiment by performing either double-sided etching or one-sided etching. Those crystal plates will be described as the first to fifth examples of the first embodiment.

Figure 7:
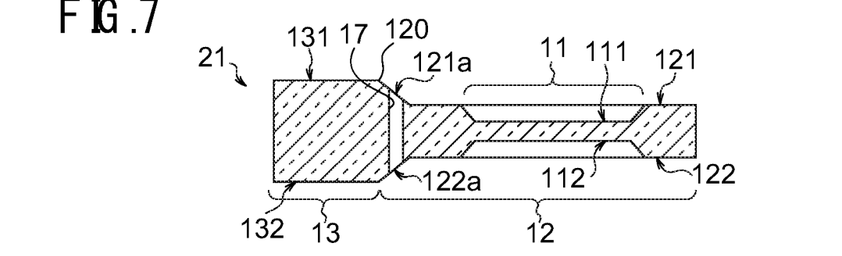
FIG. 7 is a sectional view illustrating a crystal plate according to a first example.

The crystal plate 21 of the first example illustrated in FIG. 7 is the same as those illustrated in FIG. 3 and FIG. 5. Hereinafter, same reference numerals are used for the structural elements of the crystal plates 22 to 25 corresponding to those of the crystal plate 21.

When the flat plate part 12 is formed by double-sided etching, the first face 121 of the flat plate part 12 and the first face 131 of the fixing part 13 are on different planes, and the second face 122 of the flat plate part 12 and the second face 132 of the fixing part 13 are on different planes.

When the flat plate part 12 is formed by one-sided etching, the first face 121 of the flat plate part 12 and the first face 131 of the fixing part 13 are on a same plane, and the second face 122 of the flat plate part 12 and the second face 132 of the fixing part 13 are on a same plane. Alternatively, the second face 122 of the flat plate part 12 and the second face 132 of the fixing part 13 are on a same plane while the first face 121 of the flat plate part 12 and the first face 131 of the fixing part 13 are on different planes.

When the vibration part 11 is formed by double-sided etching, the first face 111 of the vibration part 11 and the first face 121 of the flat plate part 12 are on different planes, and the second face 112 of the vibration part 11 and the second face 122 of the flat plate part 12 are on different planes.

When the vibration part 11 is formed by one-sided etching, the first face 111 of the vibration part 11 and the first face 121 of the flat plate part 12 are on a same plane while the second face 112 of the vibration part 11 and the second face 122 of the flat plate part 12 are on different planes. Alternatively, the second face 112 of the vibration part 11 and the second face 122 of flat plate part 12 are on a same plane while the first face 111 of the vibration part 11 and the first face 121 of the flat plate part 12 are on different planes.

As for the crystal plate 21 of the first example illustrated in FIG. 7, the flat plate part 12 and the vibration part 11 are both formed by double-sided etching. As described in the first embodiment, it is required to perform etching three times, which are "double-sided etching of the flat plate part 12+double-sided etching of the external shape"→"double-sided etching of the vibration part 11+double-sided etching of the external shape"→"double-sided etching of the external shape".

Figure 8:
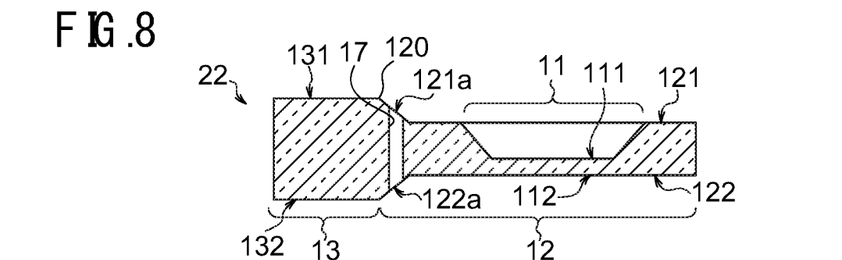
FIG. 8 is a sectional view illustrating a crystal plate according to a second example.

As for the crystal plate 22 of the second example illustrated in FIG. 8, the flat plate part 12 is formed by double-sided etching, and the vibration part 11 is formed by one-sided etching. In this case, it is required to perform etching only twice, which are "double-sided etching of the flat plate part 12+double-sided etching of the external shape"→"one-sided etching of the vibration part 11+double-sided etching of the external shape". While the vibration part 11 is formed on the first face 121 of the flat plate part 12 in the second example, the vibration part 11 may be formed on the second face 122 of the flat plate part 12. In that case, it is possible to have the same sectional shape as that of the second example by inverting the crystal plate.

Figure 9:
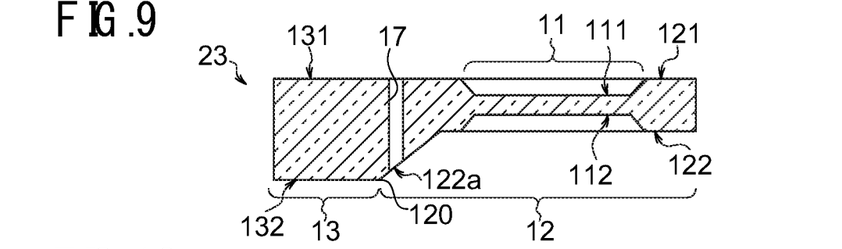
FIG. 9 is a sectional view illustrating a crystal plate according to a third example.

As for the crystal plate 23 of the third example illustrated in FIG. 9, the flat plate part 12 is formed by one-sided etching, and the vibration part 11 is formed by double-sided etching. In this case, it is required to perform etching only twice, which are "one-sided etching of the flat plate part 12+double-sided etching of the external shape"→"double-sided etching of the vibration part 11+double-sided etching of the external shape". While the flat plate part 12 is formed on the second face 132 side of the fixing part 13 in the third example, the flat plate part 12 may be formed on the first face 131 side of the fixing part 13. In that case, it is possible to have the same sectional shape as that of the third example by inverting the crystal plate (same for the fourth and fifth examples).

Figure 10:
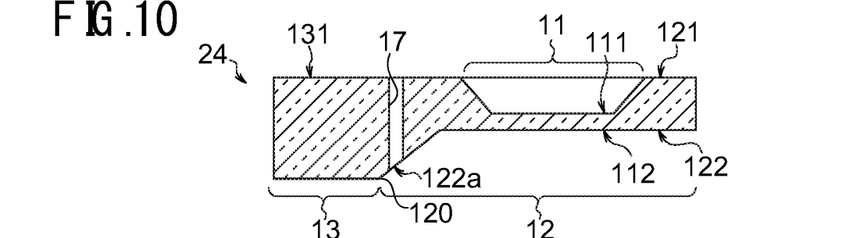
FIG. 10 is a sectional view illustrating a crystal plate according to a fourth example.

As for the crystal plate 24 of the fourth example illustrated in FIG. 10, the flat plate part 12 and the vibration part 11 are both formed by one-sided etching. In this case, it is required to perform etching only twice, which are "one-sided etching of the flat plate part 12+one-sided etching of the external shape"→"one-sided etching of the vibration part 11+double-sided etching of the external shape".

Figure 11:
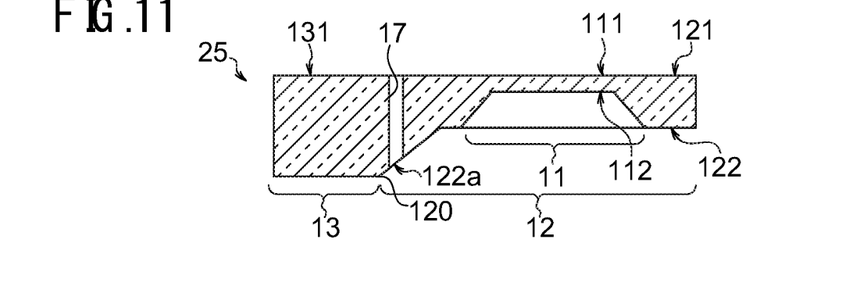
FIG. 11 is a sectional view illustrating a crystal plate according to a fifth example.

As for the crystal plate 25 of the fifth example illustrated in FIG. 11, the flat plate part 12 and the vibration part 11 are both formed by one-sided etching like the crystal plate 24 of the fourth example. Note, however, that the vibration part 11 is formed on the second face 122 of the flat plate part 12 in the fifth example, while the vibration part 11 is formed on the first face 121 of the flat plate part 12 in the fourth example. In this case, it is required to perform etching only twice, which are "one-sided etching of the flat plate part 12+one-sided etching of the external shape"→"one-sided etching of the vibration part 11+double-sided etching of the external shape".

The configuration, operations, and effects of the crystal element that includes the crystal plates 21 to 25 according to each of the examples are the same as those of the crystal element of the first embodiment.

Second Embodiment

Figure 12:
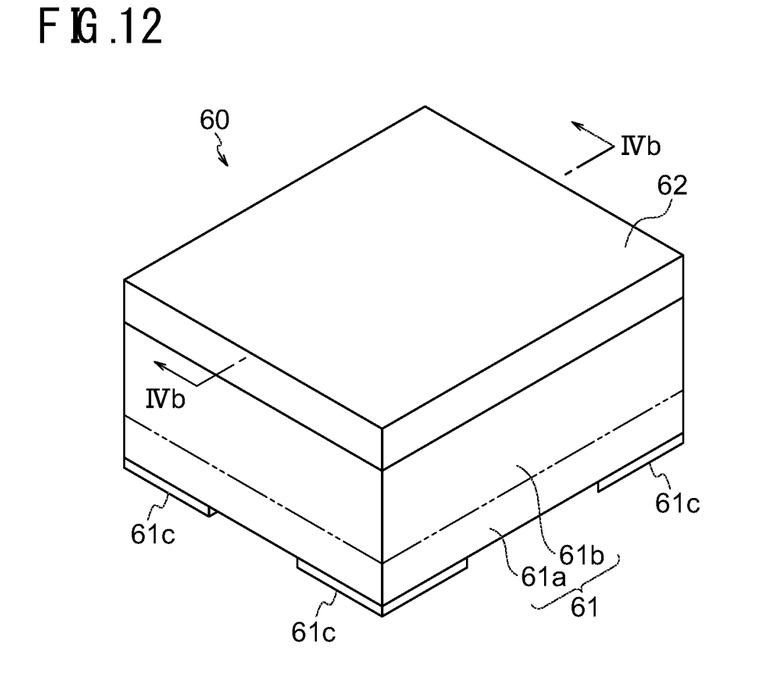
FIG. 12 is a perspective view illustrating a crystal device according to a second embodiment.
Figure 13:
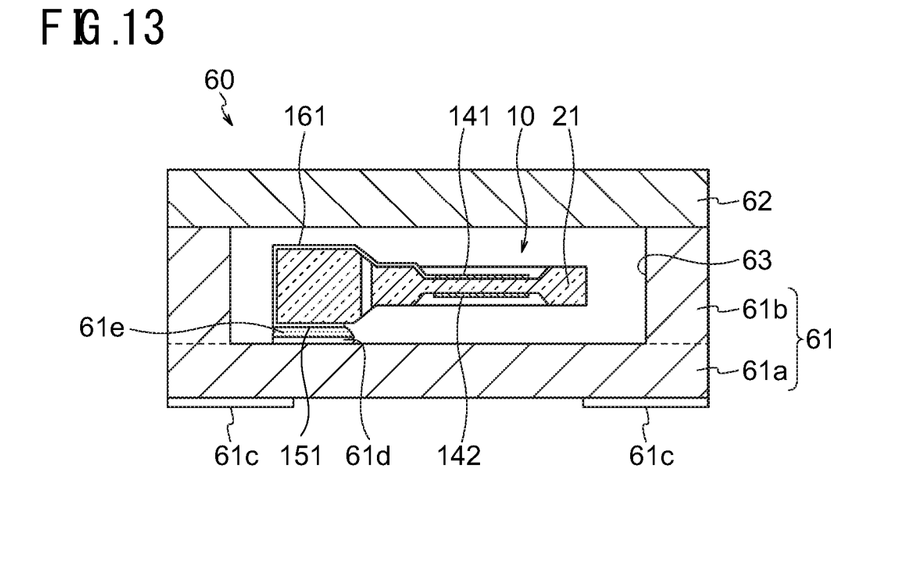
FIG. 13 is a sectional view taken along the line IVb-IVb of FIG. 12.

FIG. 12 is a perspective view illustrating a crystal device 60 according to a second embodiment, and FIG. 13 is a sectional view taken along the line IVb-IVb of FIG. 12. Hereinafter, a crystal device including the crystal element of the first embodiment will be described as the crystal device 60 of the second embodiment by referring to those drawings.

As illustrated in FIG. 12 and FIG. 13, the crystal device 60 according to the second embodiment includes: the crystal element 10 of the first embodiment; a base body 61 where the crystal element 10 is disposed; and a lid 62 that, together with the base body 61, airtightly seals the crystal element 10. The base body 61 is also referred to as a package, which is configured with a substrate 61a and a frame 61b. The space surrounded by the top face of the substrate 61a, the inner face of the frame 61b, and the bottom face of the lid 62 forms a housing part 63 of the crystal element 10. The crystal element 10 outputs reference signals used in an electronic device and the like, for example.

In other words, the crystal device 60 includes: the substrate 61a that includes a pair of electrode pads 61d on its top face and four external terminals 61c on its bottom face; the frame 61b disposed along the outer peripheral edge of the top face of the substrate 61a; the crystal element 10 mounted on the pair of electrode pads 61d via a conductive adhesive 61e; and the lid 62 that, together with the frame 61b, airtightly seals the crystal element 10.

The substrate 61a and the frame 61b are made of a ceramic material such as alumina ceramics or glass ceramics, for example, and integrally formed into the base body 61. The base body 61 and the lid 62 are roughly in a substantially rectangular shape on a plan view. The external terminals 61c, the electrode pads 61d, and the lid 62 are electrically connected via a conductor formed on the inner side or the side face of the base body 61. More specifically, each of the external terminals 61c is disposed at the four corners of the bottom face of the substrate 61a. Two external terminals 61c among those are electrically connected to the crystal element 10, and the remaining two external terminals 61c are electrically connected to the lid 62. The external terminals 61c are used for being mounted to a printed wiring board or the like of an electronic device and the like.

As described above, the crystal element 10 includes: the crystal plate 21; the excitation electrode 141 formed on the top face of the crystal plate 21; and the excitation electrode 142 formed on the bottom face of the crystal plate 21. Then, the crystal element 10 is bonded on the electrode pads 61d via the conductive adhesive 61e, and plays a role to oscillate the reference signals of the electronic device and the like by the stable mechanical vibration and piezoelectric effect.

The electrode pad 61d is for mounting the crystal element 10 in the base body 61, and a pair of which is disposed adjacent to each other along one side of the substrate 61a. The pair of electrode pads 61d connects the mounting electrodes 151 and 152, respectively, and fixes the crystal element 10 on the substrate 61a with a cantilever support structure with one end of the crystal element 10 being a fixed end and the other end of the crystal element 10 being the free end isolated from the top face of the substrate 61a.

As for the conductive adhesive 61e, conductive powder as a conductive filler is contained in a binder such as a silicone resin. The lid 62 is formed with an alloy containing at least iron, nickel, or cobalt, for example, and airtightly seals the housing part 63 in a vacuum state or filled with a nitrogen gas or the like by being joined to the frame 61b by seam welding or the like.

With the crystal device 60 that includes the crystal element 10, it is possible to provide a stable electrical characteristic. The crystal device 60 is mounted on the surface of the printed board configuring an electronic device by fixing the bottom faces of the external terminals 61c to the printed board by soldering, gold (Au) bumps, a conductive adhesive, or the like. Furthermore, the crystal device 60 is used as an oscillation source in various kinds of electronic devices such as a smartphone, a personal computer, a clock, a game console, a communication device, or an in-vehicle device such as a car navigation system, for example.

Others

While the present disclosure has been described above by referring to the embodiments, the present disclosure is not limited thereto. As for the configuration and details of the present disclosure, various modifications occurred to those skilled in the art can be applied. For example, while the shape of the vibration part is described to be in a substantially rectangular shape, it is also possible to be in other patterns (a circular shape, an elliptical shape, a polygonal shape, and the like).

This application is based upon and claims the benefit of priority of the prior Japanese Patent Application No. 2019-101757, filed on May 30, 2019, the entire contents of which are incorporated herein by reference.

What is claimed is:

1. A crystal element comprising, defining that a front side of two faces in a front-and-back relation is a first face, a back face is a second face, and a dimension of a direction vertically going through the first face and the second face is a thickness:
    a crystal wafer formed to define:
        a vibration part that includes a first face and a second face;
        a flat plate part that includes a first face and a second face, the flat plate part having a thickness thicker than a thickness of the vibration part and being disposed on an outer edge of the vibration part on a plan view; and
        a fixing part that includes a first face and a second face, the fixing part having a thickness thicker than the thickness of the flat plate part and being disposed on in an outer edge of the flat plate part on a plan view;
    an excitation electrode disposed on the first face and the second face of the vibration part;
    a mounting electrode disposed at least on one of the first face and the second face of the fixing part; and
    a wiring electrode that electrically connects the excitation electrode and the mounting electrode;
    wherein at least one of the first face and the second face of the flat plate part has an inclined face that becomes thinner as leaving away from the fixing part.

2. The crystal element according to claim 1, wherein the first face of the flat plate part and the first face of the fixing part are on different planes, and the second face of the flat plate part and the second face of the fixing part are on different planes.

3. The crystal element according to claim 1, wherein on a plan view, the vibration part, the flat plate part, and the fixing part are in a substantially rectangular shape, the flat plate part is disposed to surround all sides of the rectangular shape of the vibration part, and the fixing part is disposed only in one side of the rectangular shape of the flat plate part.

4. The crystal element according to claim 3, wherein, on a plan view, a distance from a center of the vibration part to the fixing part is longer than a distance from a center of the flat plate part to the fixing part.

5. The crystal element according to claim 1, further comprising a through-hole opened through a thickness direction between the mounting electrode and the vibration part.

6. A crystal device comprising:
    the crystal element according to claim 1;
    a base body where the crystal element is disposed; and
    a lid that, together with the base body, airtightly seals the crystal element.

7. A crystal element according to claim 1 wherein the crystal wafer is an AT-cut crystal plate.

8. A crystal element comprising, defining that a front side of two faces in a front-and-back relation is a first face, a back face is a second face, and a dimension of a direction vertically going through the first face and the second face is a thickness:
    a crystal wafer formed to define:
        a vibration part that includes a first face and a second face;
        a flat plate part that includes a first face and a second face, the flat plate part having a thickness thicker than a thickness of the vibration part and being disposed on an outer edge of the vibration part on a plan view; and
        a fixing part that includes a first face and a second face, the fixing part having a thickness thicker than the thickness of the flat plate part and being disposed on an outer edge of the flat plate part on a plan view;
    an excitation electrode disposed on the first face and the second face of the vibration part;
    a mounting electrode disposed at least on one of the first face and the second face of the fixing part;
    a wiring electrode that electrically connects the excitation electrode and the mounting electrode; and
    a through-hole opened through a thickness direction between the mounting electrode and the vibration part.

9. The crystal element according to claim 8, wherein the first face of the flat plate part and the first face of the fixing part are on different planes, and the second face of the flat plate part and the second face of the fixing part are on different planes.

10. The crystal element according to claim 8, wherein on a plan view, the vibration part, the flat plate part, and the fixing part are in a substantially rectangular shape, the flat plate part is disposed to surround all sides of the rectangular shape of the vibration part, and the fixing part is disposed only in one side of the rectangular shape of the flat plate part.

11. The crystal element according to claim 10, wherein, on a plan view, a distance from a center of the vibration part to the fixing part is longer than a distance from a center of the flat plate part to the fixing part.

12. A crystal device comprising:
    the crystal element according to claim 8;
    a base body where the crystal element is disposed; and
    a lid that, together with the base body, airtightly seals the crystal element.

13. A crystal element according to claim 8 wherein the crystal wafer is an AT-cut crystal plate.

14. A crystal element comprising, defining that a front side of two faces in a front-and-back relation is a first face, a back face is a second face, and a dimension of a direction vertically going through the first face and the second face is a thickness:

a crystal wafer formed to define:
  a vibration part that includes a first face and a second face;
  a flat plate part that includes a first face and a second face, the flat plate part having a thickness thicker than a thickness of the vibration part and being disposed on in an outer edge of the vibration part on a plan view; and
  a fixing part that includes a first face and a second face, the fixing part having a thickness thicker than the thickness of the flat plate part and being disposed on an outer edge of the flat plate part on a plan view;
an excitation electrode disposed on the first face and the second face of the vibration part;
a mounting electrode disposed at least on one of the first face and the second face of the fixing part; and
a wiring electrode that electrically connects the excitation electrode and the mounting electrode;
wherein
on a plan view, the vibration part, the flat plate part, and the fixing part are in a substantially rectangular shape,
the flat plate part is disposed to surround all sides of the rectangular shape of the vibration part,
the fixing part is disposed only in one side of the rectangular shape of the flat plate part, and
defining that, on a plan view, a direction perpendicular to the one side of the flat plate part along which the fixing part is disposed is a length direction,
a distance from the fixing part to the vibration part in the flat plate part is one half or more and twice or less of a dimension of the vibration part in the length direction.

15. A crystal device comprising:
the crystal element according to claim 14;
a base body where the crystal element is disposed; and
a lid that, together with the base body, airtightly seals the crystal element.

16. A crystal element according to claim 14 wherein the crystal wafer is an AT-cut crystal plate.

17. A crystal element comprising, defining that a front side of two faces in a front-and-back relation is a first face, a back face is a second face, and a dimension of a direction vertically going through the first face and the second face is a thickness:
a crystal wafer formed to define:
  a vibration part that includes a first face and a second face;
  a flat plate part that includes a first face and a second face, the flat plate part having a thickness thicker than a thickness of the vibration part and being disposed on an outer edge of the vibration part on a plan view; and
  a fixing part that includes a first face and a second face, the fixing part having a thickness thicker than the thickness of the flat plate part and being disposed on an outer edge of the flat plate part on a plan view;
an excitation electrode disposed on the first face and the second face of the vibration part;
a mounting electrode disposed at least on one of the first face and the second face of the fixing part; and
a wiring electrode that electrically connects the excitation electrode and the mounting electrode;
wherein
on a plan view, the vibration part, the flat plate part, and the fixing part are in a substantially rectangular shape,
the flat plate part is disposed to surround all sides of the rectangular shape of the vibration part,
the fixing part is disposed only in one side of the rectangular shape of the flat plate part, and
defining that, on a plan view, a direction in parallel to the one side of the flat plate part along which the fixing part is disposed is a width direction,
a distance from the outer edge of the flat plate part to the vibration part in the width direction of the flat plate part is longer than a dimension of the vibration part in the width direction.

18. A crystal device comprising:
the crystal element according to claim 17;
a base body where the crystal element is disposed; and
a lid that, together with the base body, airtightly seals the crystal element.

19. A crystal element according to claim 17 wherein the crystal wafer is an AT-cut crystal plate.

* * * * *